United States Patent
Johnson (10) Patent No.: US 7,483,462 B2
(45) Date of Patent: Jan. 27, 2009

(54) LONG WAVELENGTH VCSEL ACTIVE REGION USING SB IN GAASN BARRIER LAYERS AND INGAASN QUANTUM WELLS

(75) Inventor: Ralph H. Johnson, Murphy, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/836,176

(22) Filed: Apr. 30, 2004

(65) Prior Publication Data

US 2005/0243888 A1 Nov. 3, 2005

(51) Int. Cl.
*H01S 5/00* (2006.01)
(52) U.S. Cl. .................. 372/45.01; 372/43.01
(58) Field of Classification Search ........... 372/45.01, 372/43.01
See application file for complete search history.

(56) References Cited

U.S. PATENT DOCUMENTS

| | | | | |
|---|---|---|---|---|
| 4,032,951 | A * | 6/1977 | De Winter et al. | 257/96 |
| 5,877,519 | A | 3/1999 | Jewell | 257/190 |
| 5,960,018 | A | 9/1999 | Jewell et al. | 372/45 |
| 6,927,412 | B2 * | 8/2005 | Takahashi et al. | 257/13 |
| 2002/0075920 | A1 | 6/2002 | Spruytte et al. | 372/45 |
| 2003/0043872 | A1 * | 3/2003 | Yokozeki et al. | 372/45 |

OTHER PUBLICATIONS

Ha, W., et al., Long-Wavelength GaInNAs(Sb) Lasers on GaAs, IEEE Journal of Quantum Electronics, vol. 38, No. 9, Sep. 2002.*
Bank, S.R., et al., Low-threshold CW GaInNAsSb/GaAs laser at 1.49 um., Electronics Letters Oct. 2, 2003, vol. 39 No. 20.*

Harris, Jr., J., et al., *GaInNAs: A New Material in the Quest for Communications Lasers*, Mat. Res. Soc. Symp. Proc. vol. 722, 2002 Materials Research Society.
Bank, S., et al., *1.5 μm GaInNAs (Sb) lasers grown on GaAs by MBE*, Journal of Crystal Growth 251 (2003) 367-371.
Volz, K., et al., *The role of Sb in the MBE growth of (GaIn)(NAsSb)*, Journal of Crystal Growth 251 (2003) 360-366.
Bank, S.R., et al., *Low-threshold CW GaInNAsSb/GaAs laser at 1.49 μm*, Electronics Letters, Oct. 2, 2003, vol. 39 No. 20.
Tatum, J., et al., *Commericialization of Honeywell's VCSEL Technology*, Proceedings of the SPIE, vol. 3946, SPIE, 2000.
Ha, W., et al., *Long-Wavelength GaInNAs(Sb) Lasers on GaAs*, IEEE Journal of Quantum Electronics, vol. 38, No. 9, Sep. 2002.
Gambin, V., et al., *Nitrogen Incorporation in GaInNAs for Long Wavelength Opto-Electronic Devices*, Stanford University, EMC Jun. 28, 2001.
Gambin, V., et al., *GaInNAs Material Properties for Long Wavelength Opto-Electronic Devices*, Stanford University, MRS Nov. 2001.
Gambin, V., et al., *Long Wavelength, High Efficiency Photoluminescence from MBE Grown GaInNAsSb*, Stanford University, EMC 2002.

\* cited by examiner

*Primary Examiner*—Minsun Harvey
*Assistant Examiner*—Tod T Van Roy
(74) *Attorney, Agent, or Firm*—Workman Nydegger (57) ABSTRACT

Disclosed is a structure for an active region of a GaAs based VCSEL with strong optical output substantially within the range of 1.3 μm and potentially for the 1.5 um range, making it well suited for the transmissivity of silica core fiberoptics. The active region of the VCSEL incorporates antimony in the quantum wells and portions of the barriers. The presence of Sb substantially smooths the surface of the barriers and quantum wells during the process of beam epitaxy, causing a higher critical thickness of each of the layers, thereby enabling fabrication with significantly reduced defects.

68 Claims, 8 Drawing Sheets

LONG WAVELENGTH VCSEL ACTIVE REGION USING SB IN GAASN BARRIER LAYERS AND INGAASN QUANTUM WELLS

CROSS-REFERENCE TO RELATED APPLICATIONS

Not applicable.

BACKGROUND OF THE INVENTION

1. The Field of the Invention

The present invention relates to an active region structure for a long wavelength VCSEL incorporating antimony into its GaAsN barriers and InGaAsN quantum wells. The incorporation of Sb acts as a surfactant, thereby smoothing the growth interface. This reduces defects in the subsequent InGaAsNSb quantum well layer by eliminating seeds (steps) on which the defects may form, enhancing optical output in the 1.3 and 1.5 μm range, and improving device reliability.

2. The Relevant Technology

Vertical Cavity Surface Emitting Lasers (VCSEL) are becoming increasingly important given the proliferation of high speed data communications using fiberoptic networks. The circular profile of the output beam from VCSELs makes them ideal for coupling into fiberoptics. Further, the vertical structure of the device enables wafer scale fabrication of VCSELs, making possible two-dimensional arrays of devices for complex fiberoptic interconnection schemes as well as the incorporation of optics in integrated circuitry.

Fiberoptics for high speed data communications predominantly comprise a silica core, which has peak transmissivity and minimal dispersion at 1.55 μm and 1.3 μm respectively. Traditional GaAs VCSEL optical emission is in the 850 nm range. In order to transmit in the optimal fiberoptic wavelength range, VCSEL development has focused on decreasing the bandgap energy of GaAs in the active region of the device to impart a red shift in the optical emission. Developments toward this end include the following: the incorporation of indium in the quantum well; the addition of dilute nitrogen in the active region; improvements in the growth of multiple quantum wells through strain compensation; and the introduction of antimony in the quantum wells.

The addition of nitrogen to the InGaAs effectively decreases the bandgap energy of the quantum well by both the material composition change and the reduction in strain, extending the wavelength of the output to the 1.31 μm and potentially 1.5 um range. However the limited solubility of Nitrogen in GaAs leads to three dimensional growth and segregation into various different phases at different positions resulting in excessively broad gain spectra which is often undesirable for a VCSEL. Although lower temperatures are often used to prevent three dimensional growth, the lower temperatures result in high point defect concentrations, which decrease luminescence efficiency. Increasing the concentration of nitrogen also can cause photoluminescence to decay rapidly, which may be due to point defects. The addition of nitrogen to the barrier structure reduces the lattice constant, making it tensile relative to GaAs, and reducing the total strain of the barrier/quantum well structure. However, nitrogen may cause traps that reduce the efficiency of light emission. Further, the growth of GaAsN tends to cause three dimensional growth resulting in seeds, or steps, for segregation or dislocations in the InGaAsN quantum wells.

Current practice is to increase active region gain and thereby enhance VCSEL optical output power by growing multiple quantum wells, each stacked between barrier layers, within the active region. Strain compensation accommodates the effective stacking of barriers and quantum wells while maintaining integrity of their respective crystal structures.

Figure 1:
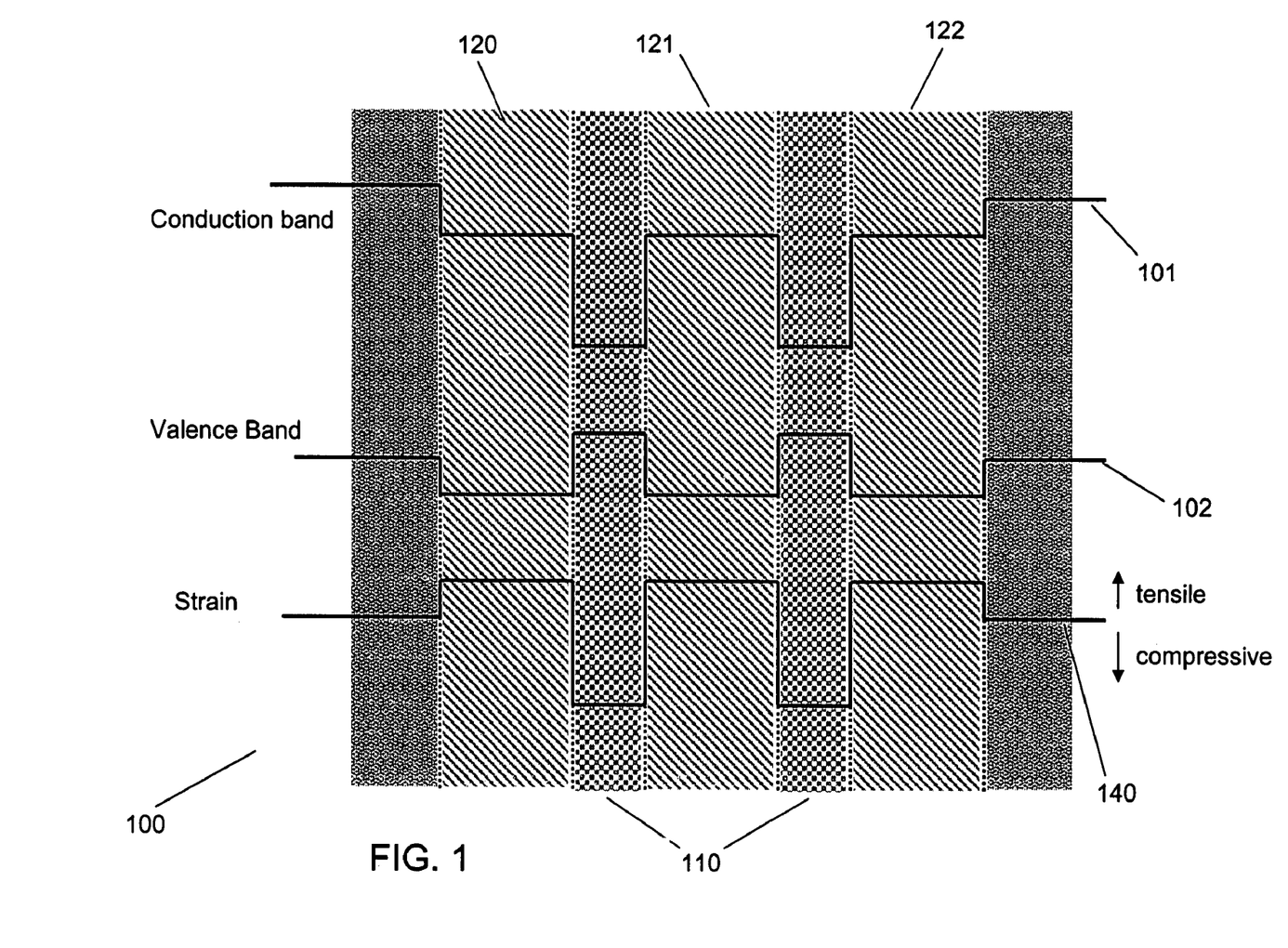
FIG. 1 shows a bandgap and strain diagram for an active region structure with GaAsN barriers and InGaAsN quantum wells, as implemented in the related art.

FIG. 1 shows an active region structure 100 according to the related art. Conduction band 101 and valence band 102 diagrams show the bandgap features according to structure 100. Tensile GaAsN barrier layers 120, 121, and 122 provide strain compensation for compressive InGaAsN quantum wells 110, as indicated in the strain plot 140. The conduction and valence band diagrams 101 and 102 respectively represent the depth of the quantum wells 110 relative to the GaAsN barriers, according to the related art. Although the addition of nitrogen substantially shifts the wavelength of optical emissions into the near infrared, the traps that may result from nitrogen limit the performance and reliability of the device.

It has been proposed that greater and lesser concentrations of nitrogen may be accommodated in InGaAsN quantum well through the incorporation of antimony. The addition of antimony enhances the stability of the alloy which allows for more nitrogen and increases the effective critical thickness by flattening the surfaces. An additional benefit of the incorporation of Sb, due to the increase in effective critical thickness, is that it enables increased proportions of indium or reduced proportions of nitrogen, further enhancing the luminescence performance of the active region. The enhanced stability of the alloy also allows increased nitrogen concentrations, thereby enabling longer wavelengths utilizing more N, Sb, and In. Tests performed on InGaAsNSb have shown photoluminescence spectra as long as 1.6 μm exceeding that of InGaAsN at 1.3 μm.

According to current practice, the incorporation of antimony is difficult with strain compensation. Although it is currently possible to achieve alternating strains with antimony in the active region using nitrogen it can only be done with higher concentrations of a nitrogen and lower concentrations of antimony than desired.

SUMMARY OF THE INVENTION

Accordingly, the present invention is directed to a long wavelength VCSEL active region using Sb in barrier layers otherwise composed of combinations of GaAsN and GaAsP, and in InGaAsN quantum wells, that substantially obviates one or more of the problems due to limitations and disadvantages of the related art.

An advantage of the present invention is to provide a GaAs based VCSEL with strong optical output substantially within the range of 1.31 μm, wherein the active region of the VCSEL incorporates antimony in the quantum wells and sublayers within the barriers. The presence of Sb substantially smoothes the surface of the barriers and quantum wells during the process of molecular beam epitaxy, causing a higher effective critical thickness of each of the layers by eliminating seeds on which dislocations form, thereby enabling fabrication with significantly lower nitrogen.

Another advantage of the present invention is to provide a method for fabricating a VCSEL active region incorporating antimony, wherein the antimony smoothes the surface of the barriers. The smoothing of the surface by the Sb eliminates seeds for the segregation into different phases in the quantum well.

Another advantage of the present invention is to provide an active region structure for a VCSEL incorporating Sb in the barriers and quantum wells, wherein the addition of Sb enhances electron and hole confinement in the quantum well and barriers and increases the depth of the hole quantum wells.

Another advantage of the present invention is to provide for the mitigation of point defects incurred during the growth process by allowing substantially higher growth temperatures, which reduces point defects. This substantially enhances the luminescence efficiency of the InGaAsNSb quantum wells, thus enhancing the performance of the VCSEL.

Another advantage of the present invention is to provide for strain compensating layers or unstrained mechanical stabilizer layers as part of the barrier layers enhancing the reliability of the VCSELs. The strain compensating layers are substantially formed of compositions of GaAsNAsPSb such that their unstrained lattice constant is less than that of GaAs. Two examples of these compositions are GaAsN, GaAsP. The compositions are not limited to these two examples. Further, mechanical stabilization may be achieved to some degree by using a material such as GaAs, which is lattice matched to the GaAs substrate to form mechanical stabilizer layers.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an active region structure for a Vertical Cavity Surface Emitting Laser (VCSEL) comprises: a first barrier sublayer having a first group V composition; a second barrier sublayer comprising Sb, the second barrier sublayer having a second group V composition that is different from the first group V composition; a quantum well comprising Sb; a third barrier sublayer comprising Sb, the third barrier sublayer having a third group V composition; and a fourth barrier sublayer having a fourth group V composition that is different from the third group V composition.

In another aspect of the present invention, method for fabricating an active region of a Vertical Cavity Surface Emitting Laser (VCSEL) comprises the steps of: forming a first barrier sublayer having a first group V composition; forming a second barrier sublayer including Sb, the second barrier sublayer having a second group V composition that is different from the first group V composition; forming a quantum well comprising Sb; forming a third barrier sublayer including Sb, the third barrier sublayer having a third group V composition; and forming a fourth barrier sublayer having a fourth group V composition that is different from the third group V composition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

The present invention incorporates antimony in the barriers and quantum wells of a VCSEL active region structure. The barriers of the present invention include multiple possible arrangements of two sublayers: a tensile or unstrained sublayer formed from a tensile or unstrained composition of GaAsPSbN such as GaAsN, GaAsP or GaAs; and a compressive GaAsNSb sublayer, wherein the GaAsNSb sublayers may be adjacent to the quantum wells and optimally are adjacent to the quantum wells on the first to be grown side. This arrangement of sublayers and quantum wells substantially enables strain compensation or mechanical stabilization, improving reliability. Further, the use of multiple sublayers, wherein at least one sublayer includes antimony, substantially enables higher concentrations of antimony and lower concentrations of nitrogen than is possible with an essentially uniform barrier layer.

The presence of Sb substantially smooths the surface of the barrier layer during molecular beam epitaxy. Experiments have shown that 50-100 Å of Sb containing material (GaAsNSb) in the barriers may be enough to sufficiently smooth the surface. This effect may be observed when Sb is optimally 6% of the group V content, but is useful from concentrations as low as 0.5% and as high as 12%. Smoothing the surface of the barriers before the quantum wells are grown may cause a higher critical thickness in the quantum well, allowing a lower nitrogen concentration. This may effectively reduce the traps caused by nitrogen and improve hole confinement by increasing the valence band well depth.

The presence of Sb in the quantum well and the barrier sublayers adjacent to the quantum well, combined with the GaAsN barrier sublayers, may additionally serve to enhance both the electron and hole confinement, making for more efficient optical emission.

Figure 2:
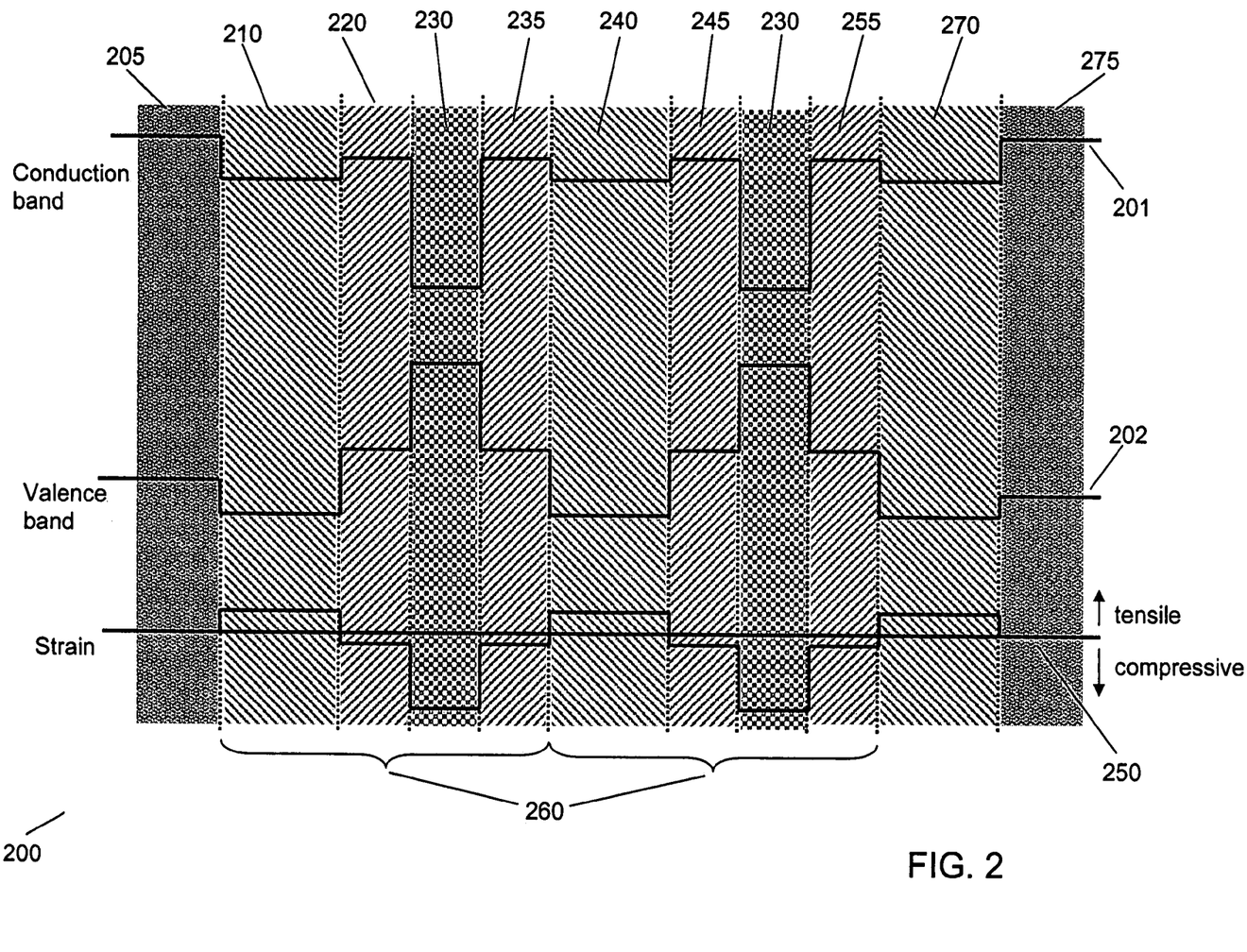
FIG. 2 is a bandgap and strain diagram of a structure incorporating Sb into barrier and quantum well structures according to the present invention.

FIG. 2 shows an active region structure 200, along with a diagram of conduction band energy 201, valence band energy 202, and strain 250. The active region structure 200 has two adjacent barrier sublayers 210 and 220 between spacer layer 205 and the first quantum well 230. The spacer layer 205 may be the end layer or spacer of one side of a pair of distributed Bragg refracting mirrors (DBR) on either side of the VCSEL active region 200. The spacer layer 205 may provide phase correction. and may also act as the last/first layer of the DBR.

The spacer layer is also important in the operation of the active region in that it may provide injected carriers. In general the spacer layer 205 may or may not be made from GaAs but is generally lattice matched to the substrate. GaAs may be the optimal material. The spacer layer 205 may be p-doped, n-doped, or preferably undoped or unintentionally doped. There may be doping is in this layer, but preferably not near the quantum well.

The next sublayer is the first GaAsN barrier sublayer 210, which may have a thickness of approximately 100 Å, and may have a composition of approximately $GaAs_{0.983}N_{0.017}$. This GaAsN sublayer may provide strain compensation for the second barrier sublayer 220 and quantum well 230 by bearing a tensile strain shown in strain plot 250. Adjacent to the GaAsN barrier sublayer is a second barrier sublayer 220 comprising GaAsNSb, which may have a composition of approximately $GaAs_{0.923}N_{0.017}Sb_{0.06}$. The proportions associated with each element is relative to that element's group content; all of the compositions subsequently stated follow this convention. Barrier sublayer 220 may be under relatively weak tensile strain, but may alternatively be under a compressive strain, or zero strain depending on the relative nitrogen and Sb content. With an exemplary composition, $GaAs_{0.923}N_{0.017}Sb_{0.06}$, it is mildly compressive. Barrier sublayer 220 may be of a thickness ranging 50-100 Å, with an exemplary thickness of approximately 50 Å.

Adjacent to the second barrier layer 220 is a quantum well 230, which is one of a plurality of quantum wells optimally between two and five quantum wells, but potentially more or fewer. The quantum well 230 may be under compressive strain, and may be of a thickness of approximately 40-80 Å, for example 70 Å. The quantum well 230 may be of InGaAsNSb in a composition approximating $In_{0.3}Ga_{0.7}As_{0.943}N_{0.007}Sb_{0.05}$.

Between the two quantum wells 230 shown in FIG. 2 is a barrier comprising three barrier sublayers 235, 240, and 245. The barrier sublayer 235 adjacent to the quantum well 230 has a thickness of about 50 Å in this example, and has a composition approximating $GaAs_{0.923}N_{0.017}Sb_{0.06}$. The barrier sublayer 235 may be tensile, compressive, or under zero strain. In the embodiment shown, these barriers are under compression, as depicted in strain plot 250.

The GaAsN barrier sublayer 240 between GaAsNSb barrier sublayers 235 and 245 has a thickness of approximately 100 Å in this example, and may be composed of $GaAs_{0.983}N_{0.017}$. As with barrier sublayer 210, barrier sublayer 240 may be tensile. Barrier layer 245 may have approximately the same thickness and composition as barrier sublayer 235.

Although a two quantum well structure is shown. The strain compensation shown in strain plot 250 enables the repeating of the barrier/quantum well structure. The barrier/quantum well combination 260 may be a substantial repeat of the barrier sublayers 210, 220, quantum well 230, and barrier sublayer 235. The barrier/quantum well combination 260 may be repeated multiple times. Adjacent to the last barrier/quantum well combination 260 is a final GaAsN barrier sublayer 270, which may be substantially similar in thickness and composition to sublayer 210. The end of the active region is marked by a second spacer layer 275. As with spacer layer 205, second spacer 275 may be GaAs, and may be n-doped, p-doped, undoped, or unintentionally doped. If second spacer layer 275 is doped, the doping is preferably well away from the active region.

Although the embodiment shown in FIG. 2 has a tensile GaAsN barrier sublayer and a compressive GaAsNSb barrier sublayer. This pattern may be reversed with the advantages of strain compensation being preserved, provided that the quantum well is compressive.

Figure 5:
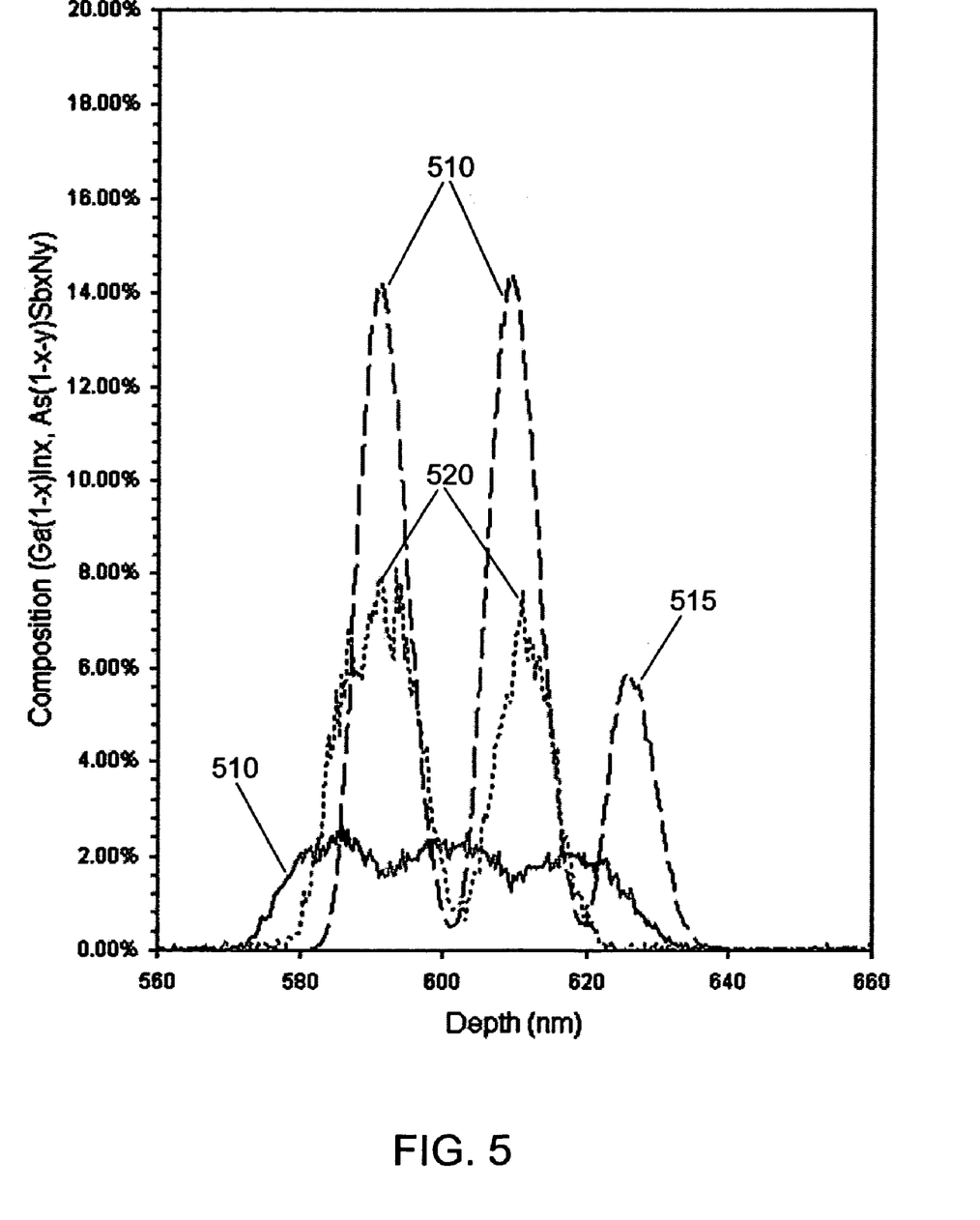
FIG. 5 shows a secondary ion mass spectroscopy (SIMS) profile of an active region structure according to the invention.

FIG. 5 is a secondary ion mass spectroscopy (SIMS) profile of the active region structure according to the present invention. The In concentrations in the two quantum wells is apparent in the peaks 510 in the In composition curve. Respective compositions of Sb and N are depicted in plots 520 and 530, respectively. The third peak 515 in the In composition plot represents the flattening layer which may not be needed in the optimal embodiment of this invention, but which was present in the analyzed sample. Notwithstanding the SIMS plot, it is difficult to determine exactly what the compositions are because the dimensions of the structure may be too small to resolve with SIMS.

Figure 6:
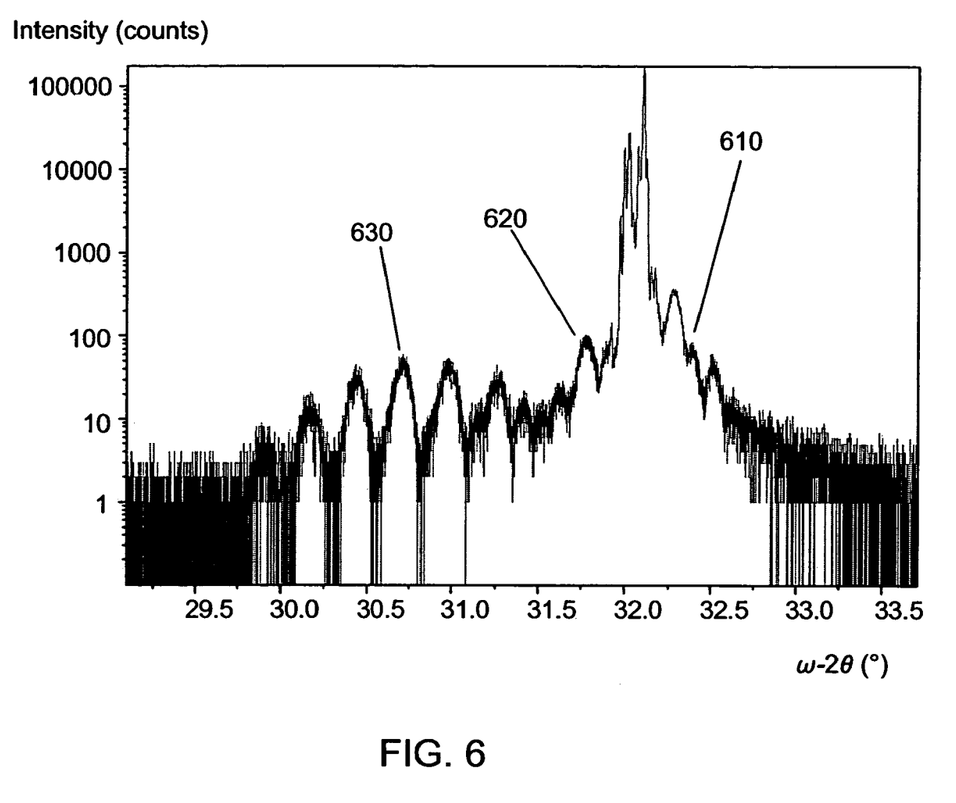
FIG. 6 is an X-ray rocking curve showing the reflection from the tensile GaAsN and the compressive GaAsNSb and InGaAsNSb according to the invention.
Figure 7:
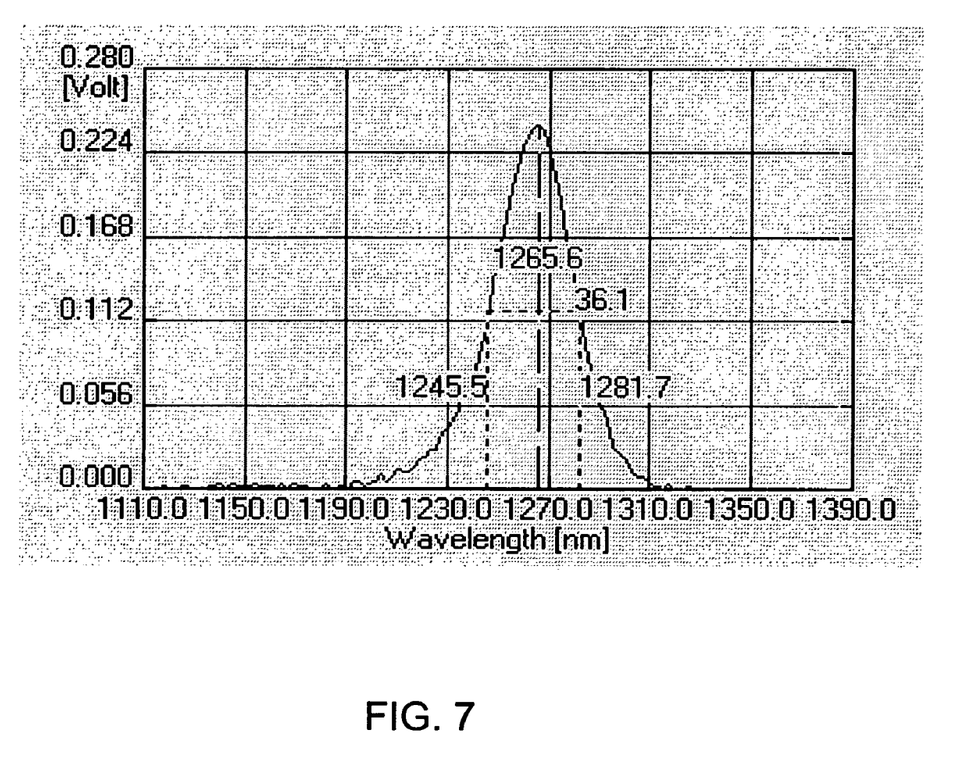
FIG. 7 is a photoluminescence (PL) spectrum related to an embodiment of the present active region.

FIG. 6 is an X-ray rocking curve for a multi-quantum well active region showing the reflection from the tensile GaAsN barriers 610, compressive GaAsNSb barriers 620, and InGaAsNSb quantum wells 630. FIG. 7 is a photoluminescence spectrum of a substantially similar structure, showing the center wavelength and FWHM of the spectral output of a VCSEL incorporating an active region of the present invention.

Figure 8:
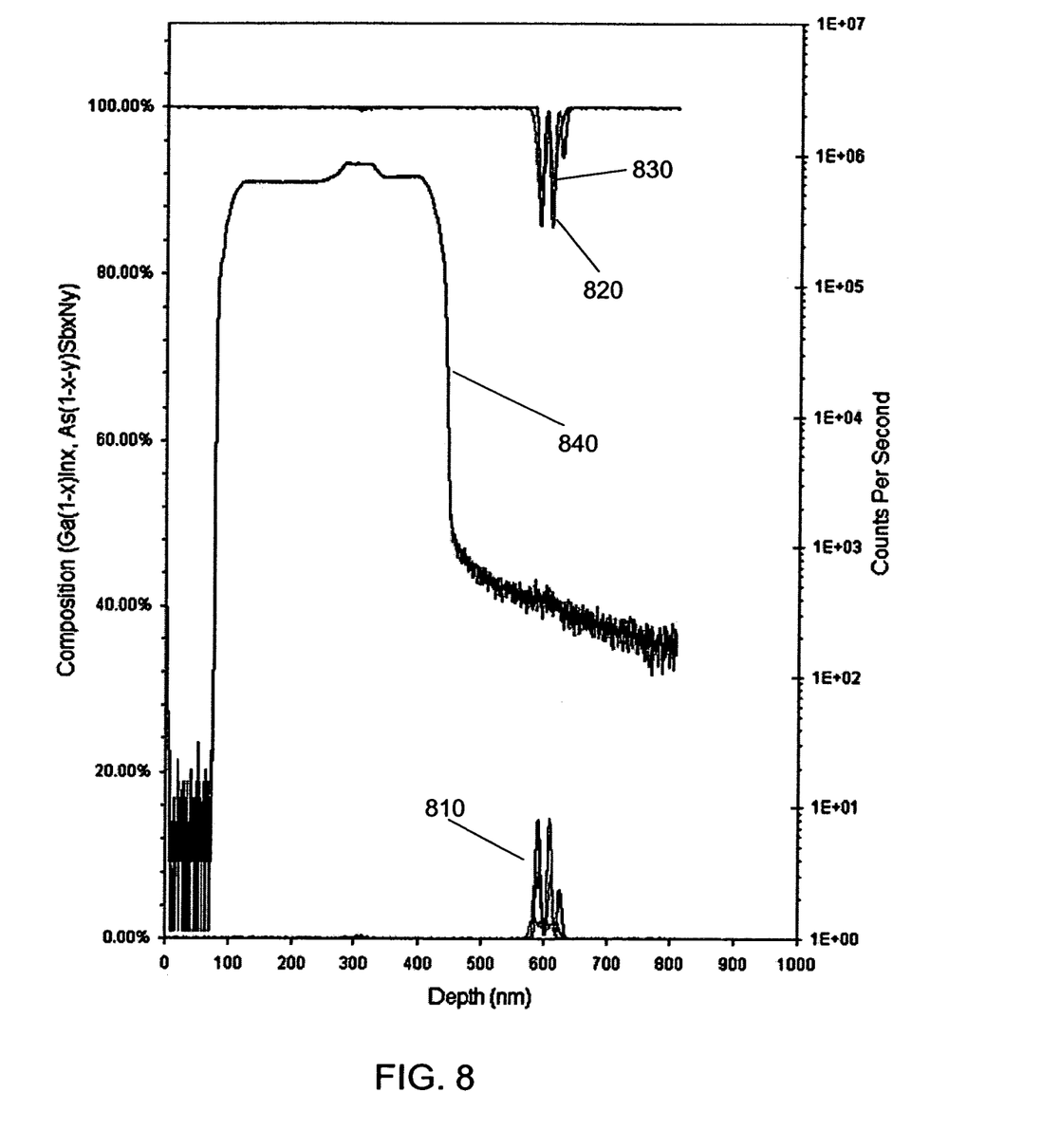
FIG. 8 is a SIMS profile of a 1 μm section of a VCSEL according to the present invention.

FIG. 8 is a SIMS profile of a portion of a VCSEL embodiment according to the present invention. The active region structure 810 is substantially the same active region structure depicted in the SIMS profile of FIG. 5, shown in the context of a 1 μm sample depth of the profiled VCSEL. The conjugate compositions given from 2 isotopes of arsenic are shown in plots 820 and 830. The SIMS composition plot of aluminum 840 represents one layer of the DBR mirror on one side of the active region, which may also be used as an oxidizing layer for current confinement. Unlike the other elements in this analysis, it is not to scale and is only used as a positional marker.

Figure 3:
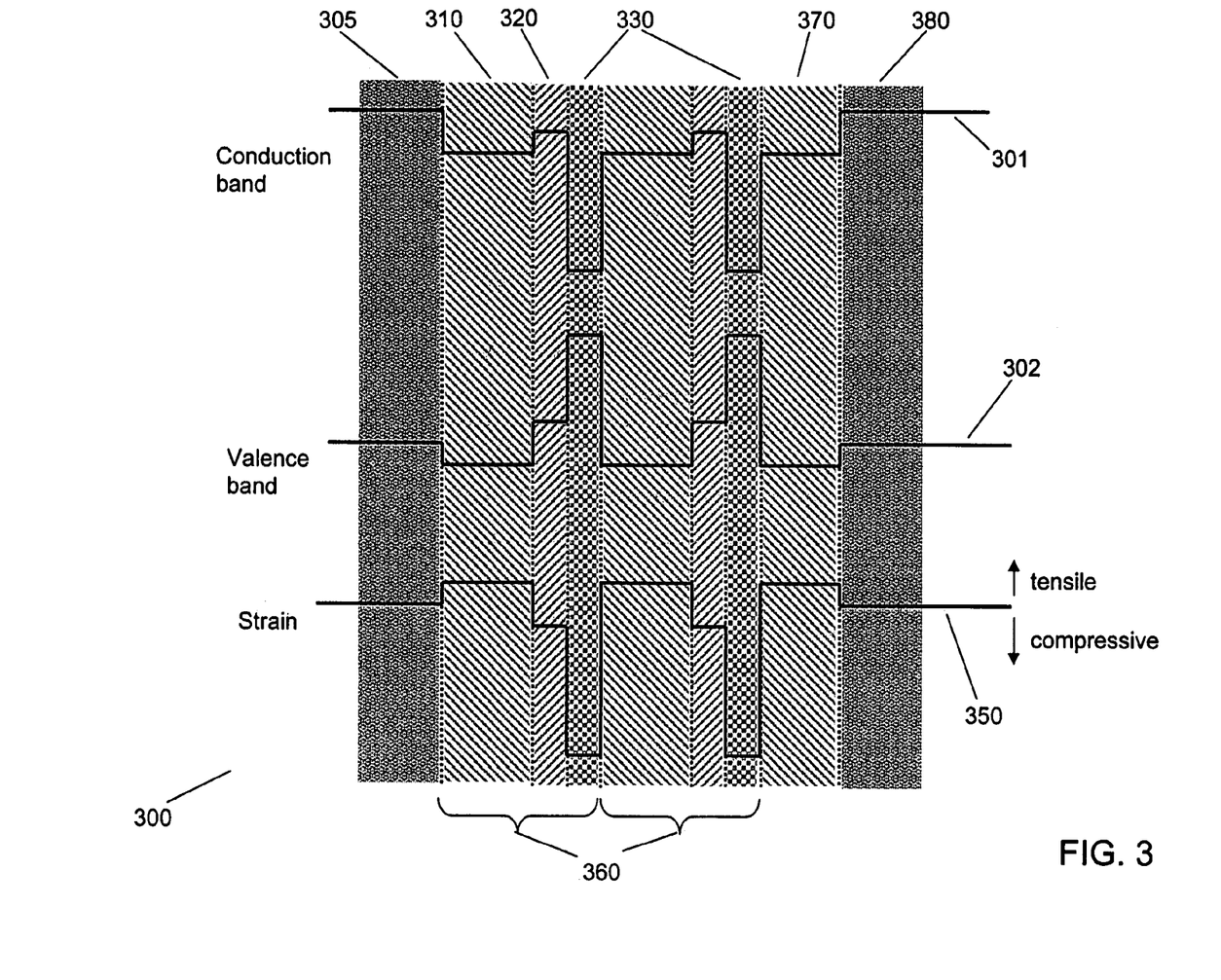
FIG. 3 is a bandgap and strain diagram of an alternative structure of the invention.
Figure 4:
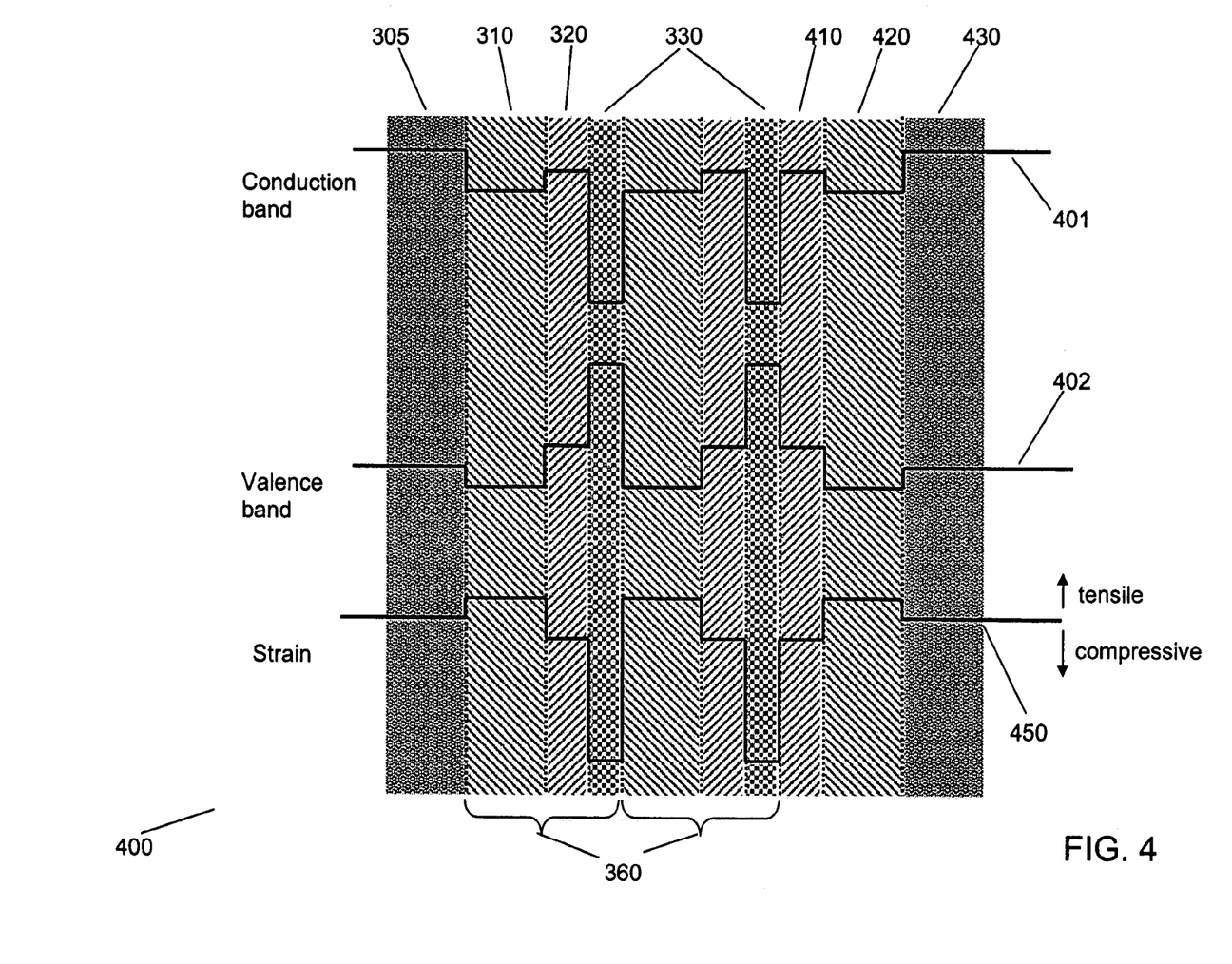
FIG. 4 is a bandgap and strain diagram of an additional alternative structure of the invention.

FIG. 3 and FIG. 4 show alternative embodiments of the present invention. FIG. 3 shows an alternate structure 300, along with diagrams of conduction band energy 301, valence band energy 302, and strain 350. Active region structure 300 has a barrier comprising a sublayers 310 and 320 adjacent to the spacer layer 305 that marks the start of the active region. Barrier sublayer 310 may have a thickness of about 100 Å and may comprise GaAsN, wherein nitrogen accounts for approximately 1.4% of the group V content. The second barrier sublayer 320 may be composed of GaAsNSb, with nitrogen and antimony accounting for approximately 1.6% and 6% of the group V content, respectively. The second sublayer 320 may have a thickness of approximately 50 Å. The quantum well 330 may comprise InGaAsNSb, in which approximately 30% of the group III content is indium, approximately 0.7% of the group V content is nitrogen, and approximately 5% of the group V content is antimony. The quantum well 330 may have a thickness of approximately 60 Å. Given the strain compensation depicted in strain plot 350, the structure comprising barrier sublayers 310 and 320 and quantum well 330, may be repeated in an additional barrier/quantum well structure 360. Multiple iterations of structure 360 are possible. At the end of the last iteration of the barrier/quantum well structure 360 is an additional barrier sublayer 370, which may be substantially similar to first barrier sublayer 310. The end of the active region may be marked by a second spacer layer 380.

FIG. 4 shows an alternate active region structure 400 of the present invention, including diagrams of conduction band energy 401, valence band energy 402, and strain 450. Active region structure 400 may incorporate barrier sublayers 310 and 320, and a quantum well 330, all of which have substantially similar thicknesses and compositions of the respective barrier sublayers and quantum wells as the embodiment shown in FIG. 3. The barrier/quantum well structure may be repeated in the structure 360. However, the embodiment shown in FIG. 4 incorporates an additional barrier sublayer 410 adjacent to the final quantum well in the active region structure. Barrier sublayer 410 may have essentially the same composition and thickness of barrier sublayer 320. A second barrier sublayer 420 interfaces between between barrier sublayer 420 and the p-doped GaAs layer 430, which marks the end of the active region structure 400. The barrier sublayers 310 and 420 are under tensile strain, providing strain compensation to the compressive barrier sublayers 320 and 410, and the quantum wells 330. The strain compensation is depicted in strain plot 450. Although a particular strain compensation configuration is shown, the barrier sublayers 320 and 410 may be under tensile strain, or no strain. Alternatively, the compressive/tensile strain differential between barrier sublayers 310/320 and 420/410 may be reversed, provided that quantum wells 330 are under compressive strain.

The structure shown in FIG. 2 may be implemented with barrier sublayer 210 made from GaAsN, or GaAsNSb, or GaAsP or GaAs or combinations thereof as long as this layer is approximately unstrained or tensile. Barrier sublayer 220 may be composed of GaAsPSb, or GaAsNSb or combinations thereof with at least 0.5% of the group V being Sb. The quantum well may be InGaAsNSb. Similarly, the active region of FIG. 3 may have barrier sublayer 310 composed of GaAsN, or GaAsNSb, or GaAsP or GaAs or combinations thereof as long as this layer is approximately unstrained or tensile. Sublayer 320 may be composed of GaAsPSb, or GaAsNSb or combinations thereof with at least 0.5% of the group V being Sb. Further, the structure of FIG. 4 may have barrier sublayers 310 and 420 of GaAsN, or GaAsNSb, or GaAsP or GaAs or combinations thereof as long as this layer is approximately unstrained or tensile. Barrier sublayers 320 and 410 may be composed of GaAsPSb, or GaAsNSb or combinations thereof with at least 0.5% of the group V being Sb. This variation of the compositions of the respective structures substantially maintains the advantages previously outlined.

One embodiment shown in FIG. 2 uses 30 Å of GaAs for sublayers 210, 240, and 270. A thickness of 50 Å of $GaAs_{0.923}N_{0.017}Sb_{0.06}$ is used for layers 220, 235, and 245. A thickness of 60 Å of $In_{0.3}Ga_{0.7}As_{0.943}N_{0.007}Sb_{0.05}$ is used for the quantum well. In this embodiment, the preferred number of quantum wells is five.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A structure for a Vertical Cavity Surface Emitting Laser (VCSEL) comprising:
   a first spacer layer;
   a first quantum-well barrier comprising,
      a first barrier sublayer having a first group V composition; and
      a second barrier sublayer comprising Sb, the second barrier sublayer having a second group V composition that is different from the first group V composition, the second barrier sublayer having a higher conduction band offset than the first barrier sublayer;
   a quantum well grown directly on the second barrier sublayer, the quantum well comprising Sb;
   a second quantum-well barrier comprising,
      a third barrier sublayer grown on the quantum well and comprising Sb, the third barrier sublayer having a third group V composition; and
      a fourth barrier sublayer having a fourth group V composition that is different from the third group V composition; and
   a second spacer layer.

2. The structure of claim 1, wherein the first barrier sublayer includes a thickness of approximately 100 Å.

3. The structure of claim 1, wherein the first barrier Sublayer includes a thickness of approximately 30 Å.

4. The structure of claim 1, wherein the first barrier sublayer comprises one of GaAs, GaAsP, and GaAsN.

5. The structure of claim 1, wherein the first barrier sublayer comprises GaAsP.

6. The structure of claim 1, wherein the first barrier sublayer comprises GaAsN.

7. The structure of claim 6, wherein the first barrier sublayer comprises:
   a thickness of substantially 100 Å; and
   a nitrogen content of substantially 1.4%.

8. The structure of claim 6, wherein the first barrier sublayer comprises substantially $GaAs_{0.983}N_{0.017}$.

9. The structure of claim 1, wherein the second barrier sublayer includes a thickness of between substantially 50 Å and 100 Å.

10. The structure of claim 1, wherein the second barrier sublayer includes a thickness of approximately 50 Å.

11. The structure of claim 1, wherein the second group V composition comprises a Sb proportion between substantially 0.5% and 12%.

12. The structure of claim 1, wherein the second group V composition comprises a Sb proportion of substantially 6%.

13. The structure of claim 1, wherein the second barrier sublayer comprises GaAsNSb.

14. The structure of claim 13, wherein the second barrier sublayer comprises substantially $GaAs_{0.923}N_{0.017}Sb_{0.06}$.

15. The structure of claim 13, wherein the second barrier sublayer comprises:
   a nitrogen content of substantially 1.6%;
   an antimony content of substantially 6%;
   a thickness of substantially 50 Å.

16. The structure of claim 1, wherein the second barrier sublayer comprises GaAsPSb.

17. The structure of claim 1, wherein the quantum well includes a thickness between substantially 40 Å and 80 Å.

18. The structure of claim 1, wherein the quantum well includes a thickness of substantially 70 Å.

19. The structure of claim 1, wherein the quantum well includes a thickness of substantially 60 Å.

20. The structure of claim 1, wherein the quantum well comprises InGaAsNSb.

21. The structure of claim 20, wherein the quantum well comprises $In_{0.3}, Ga_{0.7}As_{0.943}N_{0.007}Sb_{0.05}$.

22. The structure of claim 20, wherein the quantum well comprises:
   an indium content of substantially 30%;
   a nitrogen content of substantially 0.7%;
   an antimony content of substantially 5%; and
   a thickness of substantially 60 Å.

23. The structure of claim 1, wherein the third barrier sublayer includes a thickness of between substantially 50 and 100 Å.

24. The structure of claim 1, wherein the third barrier sublayer includes a thickness of approximately 50 Å.

25. The structure of claim 1, wherein the third group V composition comprises a Sb proportion between substantially 0.5% and 12%.

26. The structure of claim 1, wherein the third group V composition comprises a Sb proportion of substantially 6%.

27. The structure of claim 1, wherein the third barrier sublayer comprises GaAsNSb.

28. The structure of claim 27, wherein the third barrier sublayer comprises substantially $GaAs_{0.923}N_{0.017}Sb_{0.06}$.

29. The structure of claim 1, wherein the third barrier sublayer comprises GaAsN.

30. The structure of claim 29, wherein the third barrier sublayer comprises:
a thickness of substantially 100 Å; and
a nitrogen content of substantially 1.4%.

31. The structure of claim 1, wherein the third barrier sublayer comprises GaAsPSb.

32. The structure of claim 1, wherein the fourth barrier sublayer includes a thickness of approximately 100 Å.

33. The structure of claim 1, wherein the fourth barrier sublayer includes a thickness of approximately 30 Å.

34. The structure of claim 1, wherein the fourth barrier sublayer comprises GaAs.

35. The structure of claim 1, wherein the fourth barrier sublayer comprises GaAsP.

36. The structure of claim 1, wherein the fourth barrier sublayer comprises GaAsN.

37. The structure of claim 36, wherein the fourth barrier sublayer comprises substantially $GaAs_{0.983}N_{0.017}$.

38. The structure of claim 1, wherein the fourth barrier sublayer comprises GaAsNSb.

39. The structure of claim 38, wherein the fourth barrier sublayer comprises:
a nitrogen content of substantially 1.6%;
an antimony content of substantially 6%;
a thickness of substantially 50 Å.

40. The structure of claim 1, wherein the first barrier sublayer and the fourth barrier sublayer include a tensile strain, and the quantum well includes a compressive strain.

41. The structure of claim 1, wherein the first barrier sublayer and the fourth barrier sublayer include a first compressive strain, the second barrier sublayer and the third barrier sublayer include a tensile strain, and the quantum well includes a second compressive strain.

42. The structure of claim 1, wherein the first barrier sublayer and the fourth barrier sublayer include a tensile strain, the second barrier sublayer and the third barrier sublayer include a first compressive strain, and the quantum well includes a second compressive strain.

43. An active region structure for a Vertical Cavity Surface Emitting Laser (VCSEL) comprising:
a first quantum-well barrier comprising,
a first barrier sublayer having a first group V composition; and
a second barrier sublayer having a second group V composition that is different from the first group V composition the second barrier sublayer having a higher conduction band offset than the first barrier sublayer;
a first quantum well comprising Sb positioned directly on the second barrier sublayer of the first quantum-well barrier;
a second quantum-well barrier positioned on the first quantum well, the second quantum-well barrier comprising,
a third barrier sublayer having a third group V composition; and
a fourth barrier sublayer comprising Sb, the fourth barrier sublayer having a fourth group V composition, the fourth barrier sublayer having a higher conduction band offset than the first barrier sublayer; and
a second quantum well positioned on the second quantum-well barrier.

44. The active region structure of claim 43, wherein the first barrier sublayer comprises GaAsN.

45. The active region structure of claim 43, where in the first group V composition comprises substantially 1.4% nitrogen.

46. The active region structure of claim 43, wherein the first barrier sublayer includes a thickness of approximately 100 Å.

47. The active region structure of claim 43, wherein the second barrier sublayer comprises GaAsNSb.

48. The active region structure of claim 43, wherein the second group V composition comprises:
approximately 1.6% N; and
approximately 6% Sb.

49. The active region structure of claim 43, wherein the second barrier sublayer includes a thickness of approximately 50 Å.

50. The active region structure of claim 43, wherein the quantum well comprises InGaAsNSb.

51. The active region structure of claim 43, wherein the quantum well includes a composition comprising:
an indium content of substantially 30%;
a nitrogen content of substantially 0.7%; and
an antimony content of substantially 5%.

52. The active region structure of claim 43, wherein the quantum well includes a thickness of approximately 60 Å.

53. The active region structure of claim 43, wherein the third barrier sublayer comprises GaAsN.

54. The active region structure of claim 43, wherein the third group V composition comprises substantially 1.4% nitrogen.

55. The active region structure of claim 43, wherein the fourth barrier sublayer includes a thickness of approximately 100 Å.

56. The active region structure of claim 43, wherein the fourth barrier sublayer comprises GaAsNSb.

57. The active region structure of claim 43, wherein the fourth group V composition comprises:
approximately 1.6% N; and
approximately 6% Sb.

58. The active region structure of claim 43, wherein the second barrier sublayer includes a thickness of approximately 50 Å.

59. The active region structure of claim 43, wherein the first barrier sublayer and the third barrier sublayer include a tensile strain, and the first quantum well includes a compressive strain.

60. The active region structure of claim 43, wherein the first barrier sublayer and the third barrier sublayer include a first compressive strain, the second barrier sublayer and the fourth barrier sublayer include a tensile strain, and the first quantum well includes a second compressive strain.

61. The active region structure of claim 43, wherein the first barrier sublayer and the third barrier sublayer include a tensile strain, the second barrier sublayer and the fourth barrier sublayer include a first compressive strain, and the first quantum well includes a second compressive strain.

62. A method for fabricating an active region of a Vertical Cavity Surface Emitting Laser (VCSEL) comprising the steps of:
   forming a first quantum well barrier comprising,
      a first barrier sublayer having a first group V composition;
      a second barrier sublayer including Sb, the second barrier layer having a second group V composition that is different from the first group V composition, the second barrier sublayer having a higher conduction band offset than the first barrier sublayer;
   forming a first quantum well comprising Sb directly on the second barrier sublayer of the first quantum well barrier;
   forming a second quantum well barrier on the first quantum well, the second quantum well barrier comprising,
      a third barrier sublayer having a third group V composition; and
      a fourth barrier sublayer having a fourth group V composition that is different from the third group V composition, the fourth barrier sublayer having a higher conduction band offset than the first barrier sublayer; and
   forming a second quantum well on the fourth barrier sublayer of the second quantum well barrier.

63. The method of claim 62, wherein the forming comprises molecular beam epitaxy.

64. The method of claim 62, wherein the step of forming a first barrier sublayer comprises the step of depositing a layer including GaAs and a thickness of substantially 30 Å.

65. The method of claim 62, wherein the step of forming a second barrier sublayer comprises the step of depositing a layer including GaAsNSb and a thickness of substantially 50 Å.

66. The method of claim 62, wherein the step of forming a quantum well comprises the step of depositing a layer including InGaAsNSb and a thickness of substantially 60 Å.

67. The method of claim 62, wherein the step of forming a third barrier sublayer comprises the step of depositing a layer including GaAsNSb and a thickness of substantially 50 Å.

68. The method of claim 62, wherein the step of forming a fourth barrier sublayer comprises the step of depositing a layer including GaAs and a thickness of substantially 30 Å.

* * * * *